(12) United States Patent
Lee et al.

(10) Patent No.: US 10,546,913 B2
(45) Date of Patent: Jan. 28, 2020

(54) TILE DISPLAY DEVICES AND DISPLAY DEVICES

(71) Applicant: InnoLux Corporation, Miao-Li County (TW)

(72) Inventors: Kuan-Feng Lee, Miao-Li County (TW); Tsung-Han Tsai, Miao-Li County (TW); Yuan-Lin Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/893,870

(22) Filed: Feb. 12, 2018

(65) Prior Publication Data

US 2019/0043940 A1 Feb. 7, 2019

Related U.S. Application Data

(60) Provisional application No. 62/539,579, filed on Aug. 1, 2017.

(51) Int. Cl.
*H01L 27/32* (2006.01)
*G02F 1/1333* (2006.01)
*H01L 27/15* (2006.01)

(52) U.S. Cl.
CPC ...... *H01L 27/3293* (2013.01); *G02F 1/13336* (2013.01); *H01L 27/156* (2013.01)

(58) Field of Classification Search
CPC .............. H01L 27/3293; H01L 27/156; G02F 1/13336
See application file for complete search history.

(56) References Cited

U.S. PATENT DOCUMENTS

| | | | |
|---|---|---|---|
| 7,495,638 B2* | 2/2009 | Lamvik | G02B 27/0172 345/76 |
| 2004/0051944 A1 | 3/2004 | Stark | |
| 2012/0120084 A1* | 5/2012 | Li | G09G 5/02 345/589 |
| 2015/0093086 A1 | 4/2015 | Wu | |
| 2015/0097837 A1* | 4/2015 | Jepsen | G06F 3/1446 345/428 |
| 2018/0249163 A1* | 8/2018 | Curcio | H04N 19/167 |
| 2018/0269352 A1* | 9/2018 | Tian | H01L 33/0095 |

OTHER PUBLICATIONS

European Search Report dated Dec. 21, 2018, issued in application No. EP 18180473.3.

* cited by examiner

*Primary Examiner* — Matthew L. Reames
(74) *Attorney, Agent, or Firm* — McClure, Qualey & Rodack, LLP

(57) ABSTRACT

A tile display device is provided. The tile display device includes a first tile substrate, the first tile substrate includes a first portion and a second portion. The tile display device also includes a second tile substrate, and the second tile substrate is adjacent to the first portion of the first tile substrate. A plurality of light emitting units disposed on the first tile substrate and the second tile substrate. A unit density of light emitting units of the first portion is defined as a first unit density, a unit density of light emitting units of the second portion is defined as a second unit density, and the first unit density is greater than the second unit density.

6 Claims, 7 Drawing Sheets

TILE DISPLAY DEVICES AND DISPLAY DEVICES

CROSS REFERENCE TO RELATED APPLICATIONS

This Application claims priority of U.S. Provisional Application No. 62/539,579, filed Aug. 1, 2017, the entirety of which is incorporated by reference herein.

BACKGROUND

Field of the Disclosure

The disclosure relates to tile display devices, and in particular to tile display devices having portions with different unit densities.

Description of the Related Art

Generally, displays range in sire from small displays used in mobile devices to very large displays visible to thousands of viewers. Large displays are sometimes created from tiling smaller display panels together. However, since the frame of each of the small display panels may be noticed by the user, the joints and seams between small display panels may reduce the quality of the overall visual effect, especially in large high-resolution tile display devices.

Although existing tile display devices and display panels have been adequate for their intended purposes, they have not been entirely satisfactory in all respects. Therefore, there are still some problems that remain to be overcome with regards to the tile display devices and display devices.

SUMMARY

Some embodiments of the disclosure provide tile display devices or display devices. The tile display device includes a first tile substrate and a second tile substrate. The first tile substrate includes a first portion and a second portion. The second tile substrate is adjacent to the first portion of the first tile substrate. A plurality of light emitting units are disposed on the first tile substrate and the second tile substrate. A unit density of light emitting units of the first portion is defined as a first unit density, a unit density of light emitting units of the second portion is defined as a second unit density, and the first unit density is greater than the second unit density.

A tile display device includes a first tile substrate and a second tile substrate. The first tile substrate includes a plurality of first pixels and a plurality of second pixels. Each of the first pixels and each of the second pixels respectively includes a plurality of light emitting units. The second tile substrate is adjacent to the first pixels of the first tile substrate. A distance between two adjacent light emitting units of one of the first pixels is defined as a first distance, a distance between two adjacent light emitting units of one of the second pixels is defined as a second distance, and the first distance is less than the second distance.

A display device includes a substrate. The substrate includes a first portion and a second portion. The first portion is closer to an edge of the substrate than the second portion. A plurality of light emitting units is disposed on the substrate. A unit density of light emitting units of the first portion is defined as a first unit density, a unit density of light emitting units of the second portion is defined as a second unit density, and the first unit density is greater than the second unit density.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that in accordance with standard practice in the industry, various features are not drawn to scale. In fact, the dimensions of the various features may be arbitrarily increased or reduced for clarity of discussion.

DETAILED DESCRIPTION OF THE DISCLOSURE

Figure 1A:
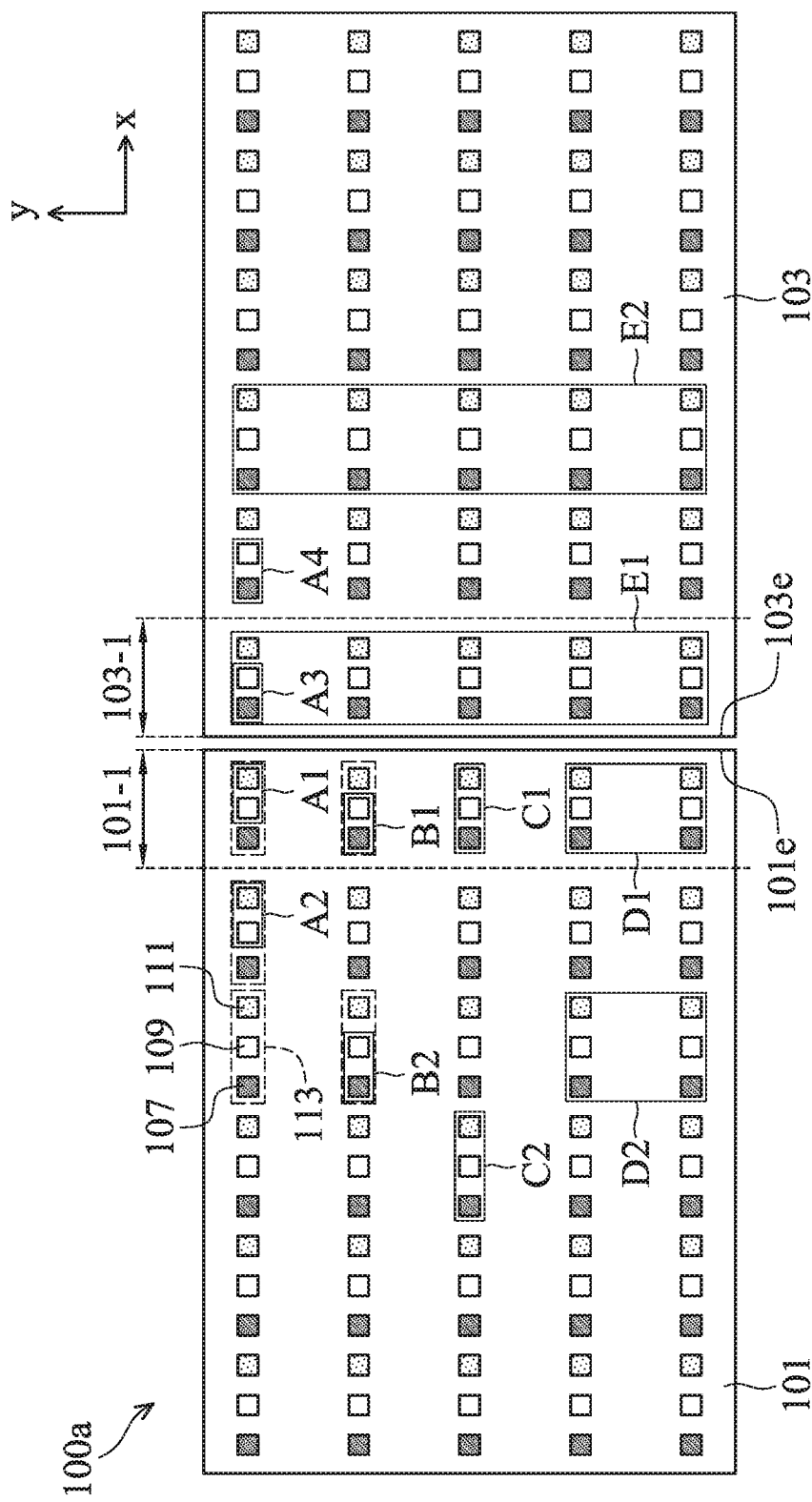
FIG. 1A is a top view of a tile display device in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and or letters in the various embodiments. This repetition is for simplicity and clarity and does not in itself dictate a relationship between the various embodiments and/or configurations discussed.

Some embodiments are described below. Throughout the various views and illustrative embodiments, like reference numbers are used to designate like features. It should be understood that additional operations can be provided before, during, and after the method, and some of the operations described can be replaced or eliminated for other embodiments of the method.

Embodiments for tile display devices are provided. Referring to FIG. 1A, a top view of a tile display device 100a according to some embodiments is shown. In some embodiments, the pixels of the tile display device 100a are arranged in a strip type of arrangement.

As shown in FIG. 1A, a first tile substrate 101 and a second tile substrate 103 are provided, in accordance with some embodiments. The first tile substrate 101 may be a glass substrate, a silicon substrate, or a plastic substrate. The material of the first tile substrate 101 may be glass, quartz, organic polymer, metal, or the like, but the disclosure is not limited thereto. If the material of the first tile substrate 101 is an organic polymer, in practical implementation, the organic polymer may be polyimide (PI), polyethylene terephthalate (PET), polycarbonate (PC), etc., but the disclosure is not limited thereto. If the material of the first tile substrate 101 is a glass substrate, the material may be made of silicon, silicon carbide (SiC), gallium nitride (GaN), silicon dioxide ($SiO_2$), sapphire, or a combination thereof, but the disclosure is not limited thereto. The materials of the second tile substrate 103 may be the same as that of the first tile substrate 101. In other embodiments, the materials of the second tile substrate 103 may be different from the materials of the first tile substrate 101, but the disclosure is not limited thereto.

In addition, the tile display device 100a may be a liquid-crystal display (LCD) device, an organic light-emitting diode (OLED) display device, a light-emitting diode (LED) display device, or another applicable display device. In some embodiments, the tile display device 100a may be a mini light-emitting diode (mini LED) display device, or a micro light-emitting diode (Micro LED) display device. For an LCD device, the light emitting units in the present disclosure refer to the sub-pixels of the LCD device.

Generally, the chip sizes of the light emitting diodes may be greater than about 300 µm, the chip sizes of the mini light-emitting diodes may be in a range from about 100 µm to about 300 µm, and the chip sizes of the micro light-emitting diodes may be smaller than about 100 µm.

The first tile substrate 101 has a first edge 101e, and the second tile substrate 103 has a second edge 103e. The first edge 101O of the first tile substrate 101 is disposed adjacent to the second edge 103e of the second tile substrate 103. In other words, the first tile substrate 101 has the first edge 101e, and the first edge 101e is facing the second edge 103e of the second tile substrate 103. In some embodiments, the tile display device 100a is composed of the first tile substrate 101 and the second tile substrate 103, and the seam between the first tile substrate 101 and the second tile substrate 103 may be approximately parallel to the direction y. More in detail, the first edge 101e and the second edge 103e may be approximately parallel to the direction y. In other embodiments, the tile display device 100a may be composed by more than two tile substrates, but the disclosure is not limited thereto.

Referring to FIG. 1A, a plurality of first light emitting units 107, a plurality of second light emitting units 109 and a plurality of third light emitting units 111 are disposed on the first tile substrate 101 and the second tile substrate 103. In some embodiments, if the tile display device 100a is a light-emitting diode (LED) display device, a mini light-emitting diode (mini LED) display device, or a micro light-emitting diode (micro LED) display device, the wiring layers (not shown) including various wiring lines or electronic circuits required for the tile display device 100a may be formed on the rear surfaces of the first tile substrate 101 or the second tile substrate 103. The wiring layers (not show may be connected with the first light emitting units 107, the second light emitting units 109 or the third light emitting units 111. Optionally, the densities of the wiring layers or electronic circuits may be varied according to the densities of light emitting units of different portions.

In some embodiments, the first light emitting units 107, the second light emitting units 109 or the third light emitting units 111 may be three-primary-color of red, green or blue light emitting units arrayed by a suitable arrangement. A single first light-emitting unit 107, a single second light emitting unit 109 and a single third light emitting unit 111 may be grouped as a pixel 113. In other embodiments, a single pixel 113 may further include a white light emitting unit, but the disclosure is not limited thereto. In more detail, a pixel 113 may be composed of red, green, blue or white light emitting units, but it is not limited thereto. In other embodiments, a single pixel 113 may include a yellow light emitting unit or a white light emitting unit. The arrangement or color of the first light emitting units 107, the second light emitting units 109 or the third light emitting units 111 are only example, not as a limitation. To achieve greater seamless visual effect, the tile display device 100a is formed of some portions with different unit densities. In the present disclosure, the term "unit density (also referred to as light emitting unit density)" is defined as the number of light emitting units in a unit area, and at least two light emitting units having different colors are disposed in the unit area. Having greater unit density may refer to having greater amount of light emitting units in the same area or having the same amount of light emitting units in a smaller area.

As shown in FIG. 1A, a first portion of the first tile substrate 101 may include the first light emitting units 107, the second light emitting units 109 or the third light emitting units 111 disposed on the first tile substrate 101. For example, a first portion A1 (solid line) and a second portion A2 (solid line) may be selected from two adjacent pixels (dashed line) on the first tile substrate 101, the first portion A1 and the second portion A2 may not overlap in the top view, and the first portion A1 is closer to the first edge 101e of the first tile substrate 101 than the second portion A2 in the direction x. The first portion A1 and the second portion A2 are arranged along the direction x, the direction x is generally perpendicular to the first edge 101e.

For the sake of simplicity and clarity, the first portion A1 and the second portion A2 are selected to include the same amount or the same color composition of light emitting units. In this embodiment, the first portion A1 and the second portion A2 respectively have two light emitting units, the light emitting units of the first portion A1 and the light emitting units of the second portion A2 should be selected in the same manner, but the light emitting units of the first portion A1 and the light emitting units of the second portion A2 are selected on different areas of the first tile substrate 101. Specifically, the first portion A1 may have one of the second light emitting units 109 and one of the third light emitting units 111, the second portion A2 may have another one of the second light emitting units 109 and another one of the third light emitting units 111.

A unit density of light emitting units of the first portion A1 is defined as a first unit density, a unit density of light emitting units of the second portion A2 is defined as a second unit density. Since the area of the second portion A2 is greater than the area of the first portion A1 and the amount of light emitting units of the second portion A2 is the same as the amount of light emitting units of the first portion A1, the first unit density is greater than the second unit density. In some embodiments, the ratio of the second unit density to the first unit density is in a range from 0.2 to 0.95 (0.2≤second unit density/first unit density≤0.95).

A third portion A3 and a fourth portion A4 are selected on the second tile substrate 103. In this embodiment, the third portion A3 is located between the first portion A1 and the fourth portion A4. In other word, the third portion A3 is closer to the second edge 103e of the second tile substrate 103 than the fourth portion A4 in the direction x.

As shown in FIG. 1A, the third portion A3 and the fourth portion A4 may respectively have two light emitting units. The light emitting units of the third portion A3 and the fourth portion A4 should be selected in the same manner (the same amount or the same color composition), but the light emitting units of the third portion A3 and the fourth portion A4 should be selected on different areas.

A unit density of light emitting units of the third portion A3 is defined as a third unit density, a unit density of light emitting units of the fourth portion A4 is defined as a fourth unit density. Since the area of the fourth portion A4 is greater than the area of the third portion A3 and the amount of light emitting units of the fourth portion A4 is the same as the third portion A3, the third unit density is greater than the fourth unit density. In some embodiments, the ratio of the fourth unit density to the third unit density is in a range from 0.2 to 0.95. On the other hands, the ratio of the first unit density to the third unit density is in a range from 0.8 to 1.25.

Moreover, in some embodiments, the first portion A1 is selected in a first border area 101-1 of the first tile substrate 101. The farthest distance between a boundary of the first border area 101-1 and the first edge 101e is less than or equal to 3 cm in the direction x. The third portion A3 is selected in a second border area 103-1 of the second tile substrate 103. The farthest distance between a boundary of the second border area 103-1 and the second edge 103e is less than or equal to 3 cm in the direction x. But the present disclosure is not limited thereto.

The second portion A2 may be selected in other area outside the first border area 101-1 of the first tile substrate 101. The fourth portion A4 may be selected in other area outside the second border area 103-1 of the second tile substrate 103.

Still referring to FIG. 1A, a first portion B1 (solid line) and a second portion B2 (solid line) are selected on the first tile substrate 101. In the embodiment, the first portion B1 and the second portion B2 are similar portions in two pixels (dashed line), and the two pixels are separated by another pixel. In detail, the first portion B1 and the second portion B2 are selected in the same manner, but the first portion B1 is closer to the first edge 101e than the second portion B2. The first portion B1 and the second portion B2, respectively have two light emitting units. Specifically, the first portion B1 has one of the first light emitting units 107 and one of the second light emitting units 109, and the second portion 32 has another one of the first light emitting units 107 and another one of the second light emitting units 109.

The area of the second portion B2 is greater than the area of the first portion. B1, and the amount of light emitting units of the first portion B1 is the same as the amount of light emitting units of the second portion B2. As a result, the first unit density of the first portion B1 is greater than the second unit density of the second portion B2.

A first portion C1 and a second portion C2 are selected on the first tile substrate 101. The first portion C1 and the second portion C2 are separated by more than one pixel 113, the first portion C1 is closer to the first edge 101e than the second portion C2, and the first portion C1 and the second portion C2 each have three light emitting units (i.e. a single pixel 113). The area of the second portion C2 is greater than the area of the first portion C1. As a result, the first unit density of the first portion C1 is greater than the second unit density of the second portion C2.

A first portion D1 and a second portion D2 are selected on the first tile substrate 101. The first portion D1 and the second portion D2 may respectively have six light emitting units (i.e. two adjacent pixels 113 arranged along the direction y). The first portion D1 is closer to the first edge 101e than the second portion D2. The area of the second portion D2 is greater than the area of the first portion D1. As a result, the first unit density of the first portion D1 is greater than the second unit density of the second portion D2.

A first portion E1 and a second portion E2 are selected on the second tile substrate 103. The first portion E1 and the second portion E2 may have fifteen light emitting units each (i.e. five adjacent pixels 113 selected along the direction y). The first portion E1 is closer to the second edge 103e than second portion E2. The area of the second portion E2 is greater than the area of the first portion E1. As a result, the first unit density of the first portion E1 is greater than the second unit density of the second portion E2.

Each pair of first portions A1, B1, C1, D1, and E1 and second portions A2, B2, C2, D2, and E2 are located along the direction x. The direction x is perpendicular to the direction of the seam (direction y).

Figure 1B:
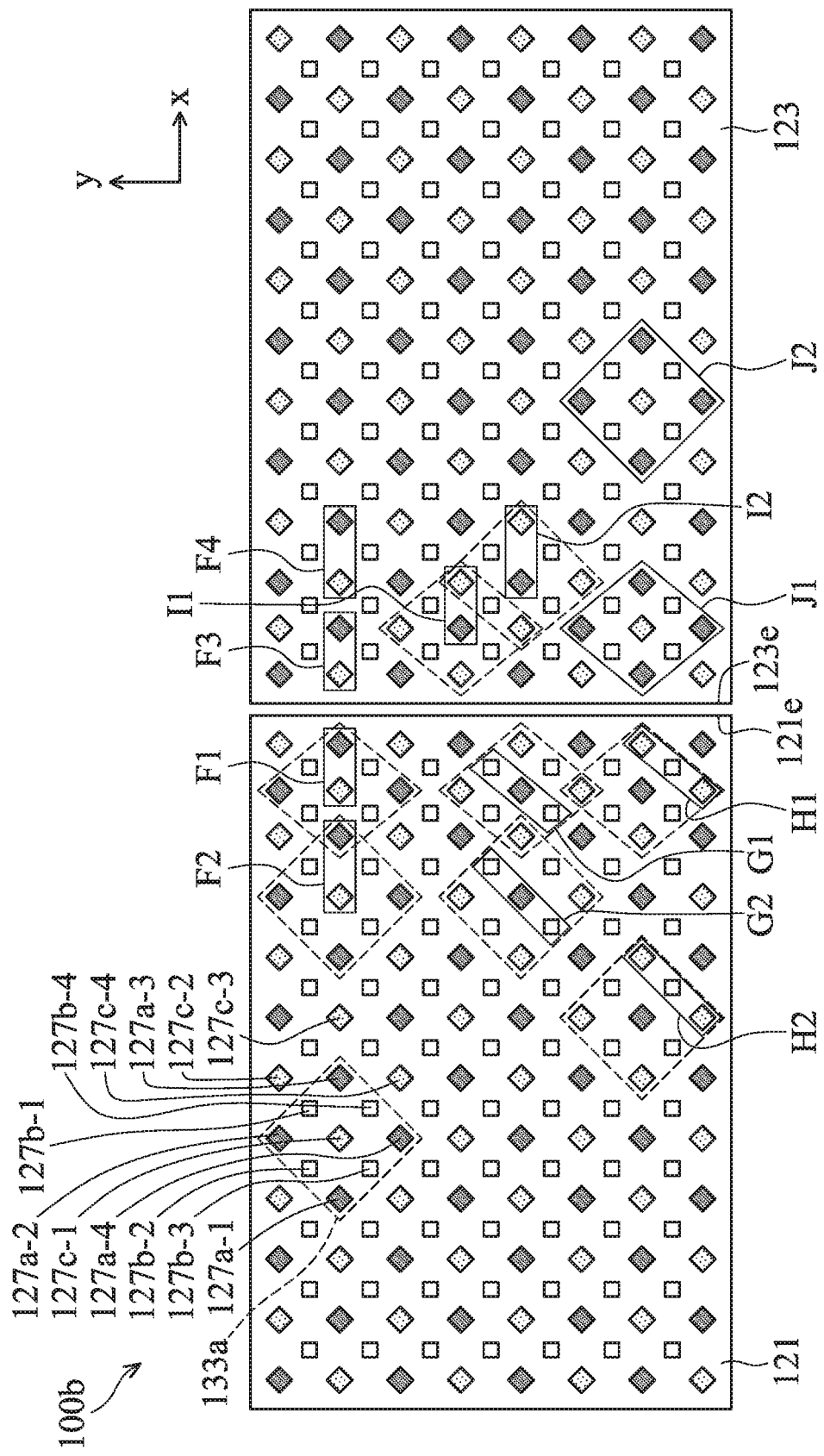
FIG. 1B is a top view of a tile display device in accordance with some other embodiments.

Referring to FIG. 1B, a top view of a tile display device 100b according to some other embodiments is shown. In some embodiments, the pixels of the tile display device 100b are arranged in a pentile arrangement.

As shown in FIG. 1B, a first tile substrate 121 and a second tile substrate 123 are provided. The first tile substrate 121 has a first edge 121e, and the second tile substrate 123 has a second edge 123e. The first edge 121e of the first tile substrate 121 is disposed adjacent to the second edge 123e of the second tile substrate 123. In other words, the first tile substrate 121 has the first edge 121e facing the second edge 123e of the second tile substrate 123.

In some embodiments, the tile display device 100b is composed of the first tile substrate 121 and the second tile substrate 123, and the seam between the first tile substrate 121 and the second tile substrate 123 may be parallel to the direction y. In other embodiments, the tile display device 100b may be composed by more than two tile substrates.

Referring to FIG. 1B, a plurality of light emitting units are disposed on the first tile substrate 121 and the second tile substrate 123. For example, a plurality of first light emitting units 127a-1, 127a-2, 127a-3, 127a-4 have the same color (red color), a plurality of second light emitting units 127b-1, 127b-2, 127b-3, 127b-4 have the same color (green color), and a plurality of third light emitting units 127c-1, 127c-2, 127c-3, 127c-4 have the same color (blue color). The first light emitting units 127a-1, 127a-2, 127a-3, 127a-4 may be arranged in the form of a rhombus. A single pixel 133a (dashed line) includes the first light emitting units 127a-1, 127a-2, 127a-3, and 127a-4 and the second light emitting units 127b-1, 127b-2, 127b-3, and 127b-4, and the third light-emitting unit 127c-1. However, the amount of light emitting units included in a single pixel is not limited to the above example.

A first portion F1, a second portion F2, a third portion F3 and a fourth portion F4 are selected in the tile display device 100b shown in FIG. 1B. The first portion F1 (solid line) and the second portion F2 (solid line) are portions in two adjacent pixels (dashed line) on the first tile substrate 121. The first portion F1 is closer to the first edge 121e of the first tile substrate 121 than the second portion F2. The third portion F3 (solid line) and the fourth portion F4 (solid line) are portions in two adjacent pixels on the second tile substrate 123, and the third portion F3 is closer to the second edge 123e of the second tile substrate 123 than the fourth portion F4. The third portion F3 is located between the first portion F1 and the fourth portion F4.

As shown in FIG. 1B, the first unit density of the first portion F1 is greater than the second unit density of the second portion F2, and the third unit density of the third portion F3 is greater than the fourth unit density of the fourth portion F4. In some embodiments, the ratio of the second unit density to the first unit density is in a range from 0.2 to 0.95. In some embodiments, the ratio of the fourth unit density to the third unit density is in a range from 0.2 to 0.95.

Moreover, in some embodiments, the ratio of the first unit density of the first portion F1 to the third unit density of the third portion F3 is in a range from 0.8 to 1.25.

Still referring to FIG. 1B, a first portion G1 (solid line) and a second portion G2 (solid line) are selected on the first tile substrate 121. In the embodiment, the first portion G1 and the second portion G2 are similar portions in two pixels (dashed line), and the two pixels do not entirely overlap in the top view, the first portion G1 is closer to the first edge 121e than the second portion G2. The light emitting units of the first portion G1 and the second portion G2 should be selected in the same manner (the same amount or the same color composition). In detail, the first portion G1 and the second portion G2 having different areas may include same number of light emitting units (i.e. sub-pixels). As a result, a first unit density of the first portion G1 is greater than a second unit density of the second portion G2.

Further, a first portion H1 (solid line) and a second portion H2 (solid line) are selected on the first tile substrate 121. In some embodiments, the first portion H1 and the second portion H2 are similar portions in two different pixels (dashed line), which are selected on the first tile substrate 121, and the two different pixels do not overlap in the top view. The first portion H1 and the second portion H2 are separated by another pixel (at least one pixel). As shown in FIG. 1B, the first portion H1 is closer to the first edge 121e than the second portion H2 in the direction x, a first unit density of the first portion H1 is greater than a second unit density of the second portion H2.

Each pair of first portions F1, G1, and H1 and the second portions F2, G2, and H2 are located along the direction x, the direction x is perpendicular to the extending direction of the seam between the first tile substrate 121 and the second tile substrate 123. In other words, a distance between the first edge 121e and the second edge 123e in the direction x can be defined as a width of the seam, if any.

The first portion I1 (solid line) and the second portion I2 (solid line) are selected on the second tile substrate 123. The first portion I1 and the second portion I2 are similar portions in two pixels (dashed line), and the two pixels are arranged in a tilted direction (the tilted direction is different from the direction x and the direction y). Moreover, the first portion I1 is closer to the second edge 123e than the second portion I2 in direction x, and a first unit density of the first portion I1 is greater than a second unit density of the second portion I2.

Still referring to FIG. 1B, the first portion J1 and the second portion J2 are selected on the second tile substrate 123. The first portion J1 may be separated from the second portion J2 by a single pixel. In other embodiments, the first portion J1 and the second portion J2 may be separated by more than one pixel. In addition, the first portion J1 is closer to the second edge 123e than the second portion J2, a first unit density of the first portion J1 is greater than a second unit density of the second portion J2.

Each pair of the first portions F1, G1, H1, I1, and J1 and the second portions F2, G2, H2, I2, and J2 is respectively selected in the same manner (the same amount or the same color composition).

Figure 2A:
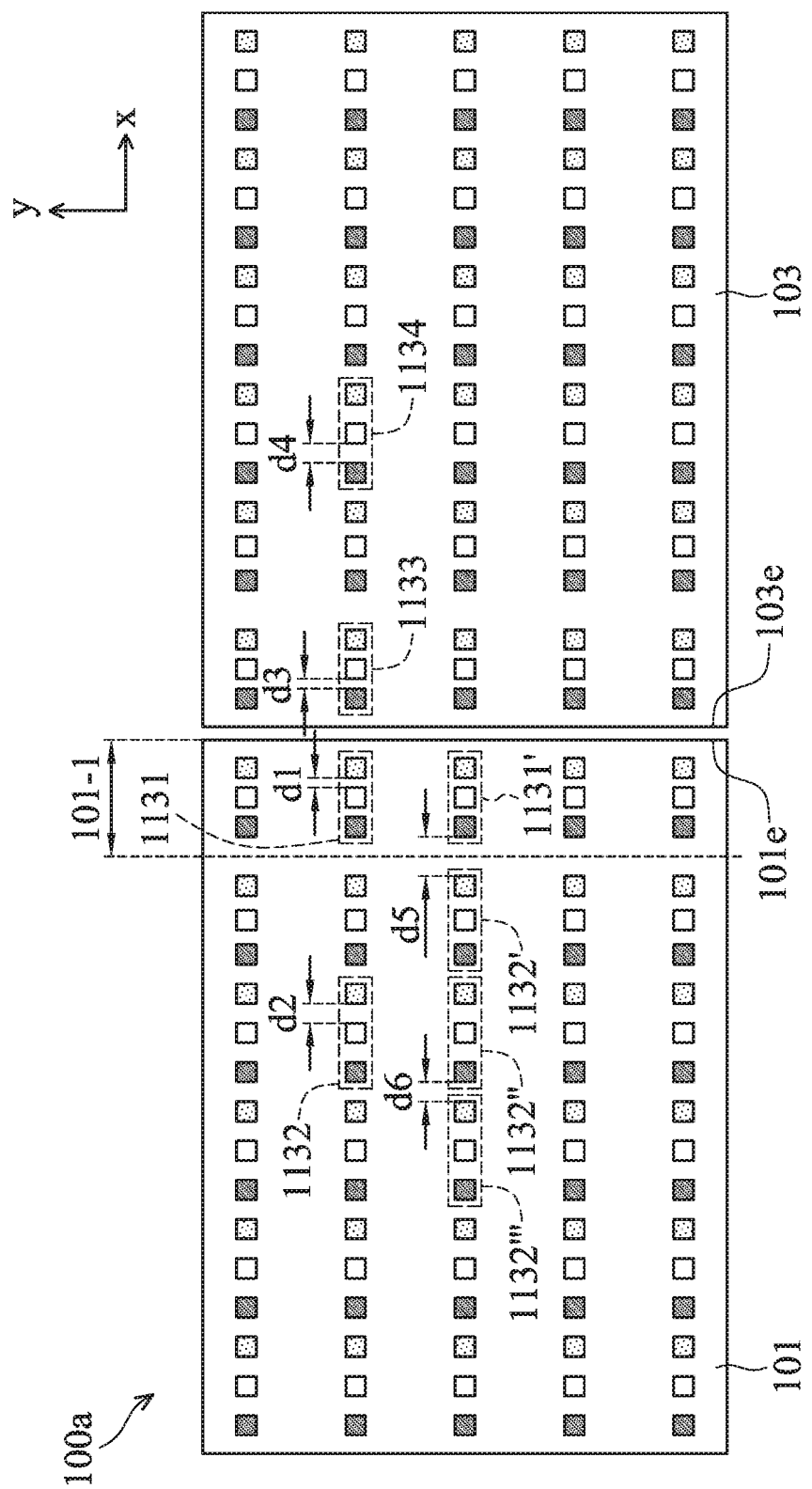
FIG. 2A is a top view of a tile display device in accordance with some embodiments.

Referring to FIG. 2A, a top view of the tile display device 100a according to some embodiments is shown. The pixels of the tile display device 100a are arranged in a strip type of arrangement.

From another point of view, a first tile substrate 101 comprising a plurality of first pixels 1131 and a plurality of second pixels 1132. Each of the first pixels 1131 and the second pixels 1132 includes a plurality of light emitting units. A second tile substrate 103 is adjacent to the first pixels 1131 of the first tile substrate 101. The first pixels 1131 are located in a first border area 101-1 of the first tile substrate 101. The farthest distance between a boundary the first border area 101-1 and the first edge 101e is less than or equal to 3 cm in the direction x.

As shown in FIG. 2A, a distance between two adjacent light emitting units of one of the first pixels 1131 is defined as a first distance d1, a distance between two adjacent light emitting units of one of the second pixels 1132 is defined as a second distance d2, and the first distance d1 is less than the second distance d2. In some embodiments, the ratio of the first distance d1 to the second distance d2 is in a range from 0.2 to 0.95. In some embodiments, the first pixel 1131 and the second pixel 1132 may not be adjacent to each other. In this embodiment, the first pixel 1131 and the second pixel 1132 are separated by another pixel.

Similarly, the second tile substrate 103 includes a plurality of third pixels 1133 and a plurality of fourth pixels 1134, the third pixels 1133 are located between the first pixels 1131 and the fourth pixels 1134, each of the third pixels 1133 and each of the fourth pixels 1134 respectively includes a plurality of light emitting units, and a distance between two adjacent light emitting units of one of the third pixels 1133 is defined as a third distance d3, a distance between two adjacent light emitting units of one of the fourth pixels 1134 is defined as a fourth distance d4, and the third distance d3 is less than the fourth d4. In some embodiments, the ratio of the third distance d3 to the fourth distance d4 is in a range from 0.2 to 0.95. Moreover, the ratio of the first distance d1 to the third distance d3 is in a range from 0.8 to 1.25.

Still referring to FIG. 2A, four adjacent pixels are selected along the direction x, for example, a first pixel 1131', and three second pixels 1132', 1132", 1132'". In some embodiments, a fifth distance d5 between two adjacent first pixel 1131' and second pixel 1132' is greater than a sixth distance d6 between two adjacent second pixel 1132" and 1132'".

Figure 2B:
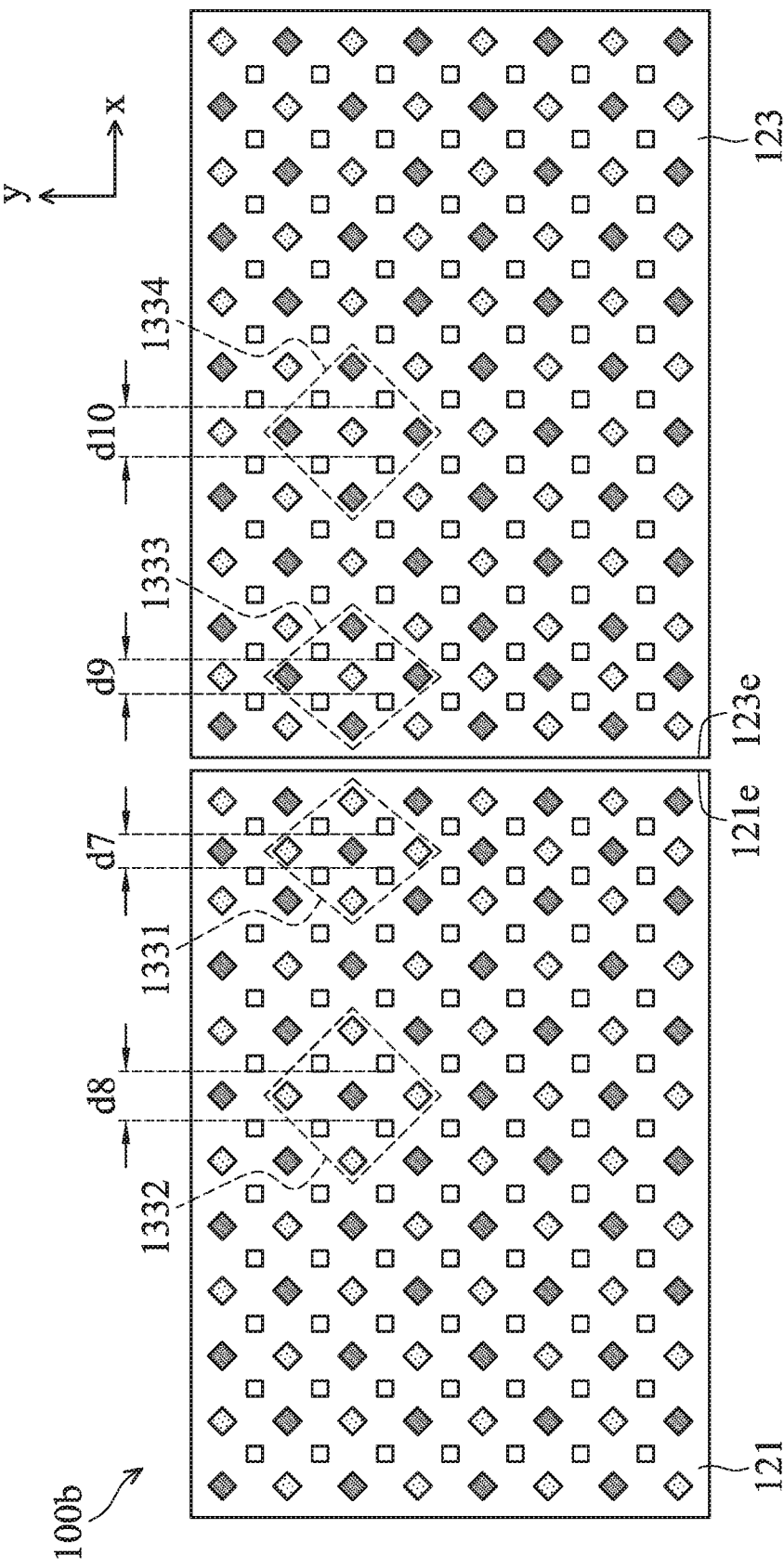
FIG. 2B is a top view of a tile display device in accordance with some other embodiments.

Referring to FIG. 2B, a top view of the display device 100b according to some other embodiments is shown. The pixels of the tile display device 100b are arranged in a pentile arrangement.

A first pixel 1331, a second pixel 1332, a third pixel 1333 and a fourth pixel 1334 are selected in the same manner as the first pixel 1131 to the fourth pixel 1134. The details of the selecting methods are not repeated herein. To sum up, the ratio of the seventh distance d7 to the eighth distance d8 is in a range from 0.2 to 0.95, the ratio of the ninth distance d9 to the tenth distance d10 is in a range from 0.2 to 0.95, and the ratio of the seventh distance d7 to the ninth distance d9 is in a range from 0.8 to 1.25.

Figure 3:
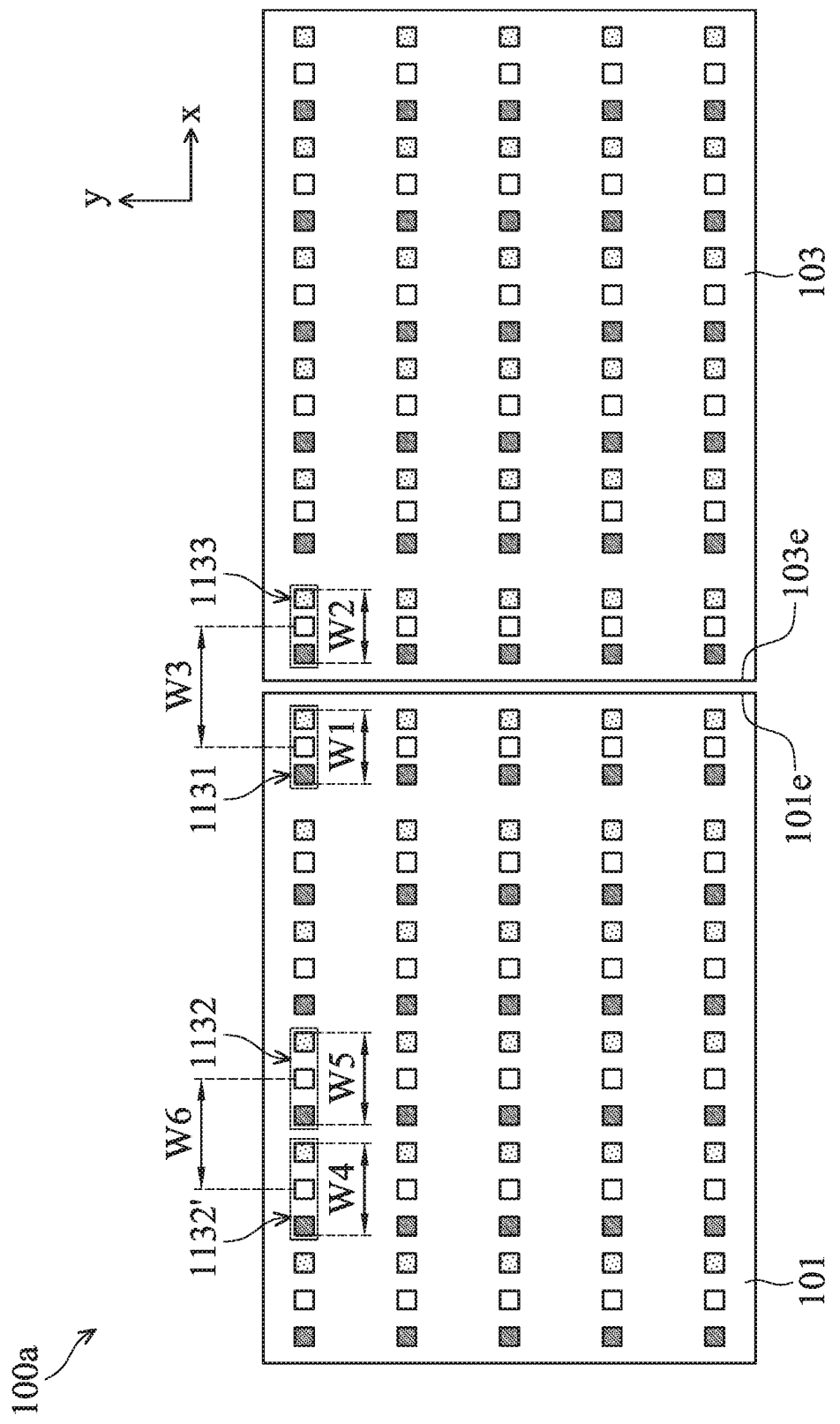
FIG. 3 is a top view of a tile display device in accordance with some embodiments.

Referring to FIG. 3, a top view of the tile display device 100a according to some embodiments is shown. In the present disclosure, the term "pixel pitch" refers to the pitch of two light emitting units having the same color and respectively in adjacent pixels. A pixel pitch of two adjacent first pixel 1131 and third pixel 1133 is defined as a first pixel pitch W3, a pixel pitch of two adjacent second pixels 1132 and 1132' is defined as a second pixel pitch W6, and a ratio of the first pixel pitch W3 to the second pixel pitch W6 is in a range from 0.9 to 1.5. In details, the first pixel 1131 has a first pixel width W1 and the third pixel 1133 has a second pixel width W2. Moreover, the second pixel 1132' has a fourth pixel width W4 and the second pixel 1132 has a fifth pixel width W5 in some embodiments, the first pixel pitch W3 is substantially equal to half of the sum of the first pixel width W1 and the second pixel width W2, and the second pixel pitch W6 is substantially equal to half of the sum of the fourth pixel width W4 and the fifth pixel width W5. In some embodiments, the value of the first pixel pitch W3 is similar to the value of the second pixel pitch W6. Since the difference between the first pixel pitch W3 and the second pixel pitch W6 is small, a greater seamless visual effect can be achieved.

Figure 4:
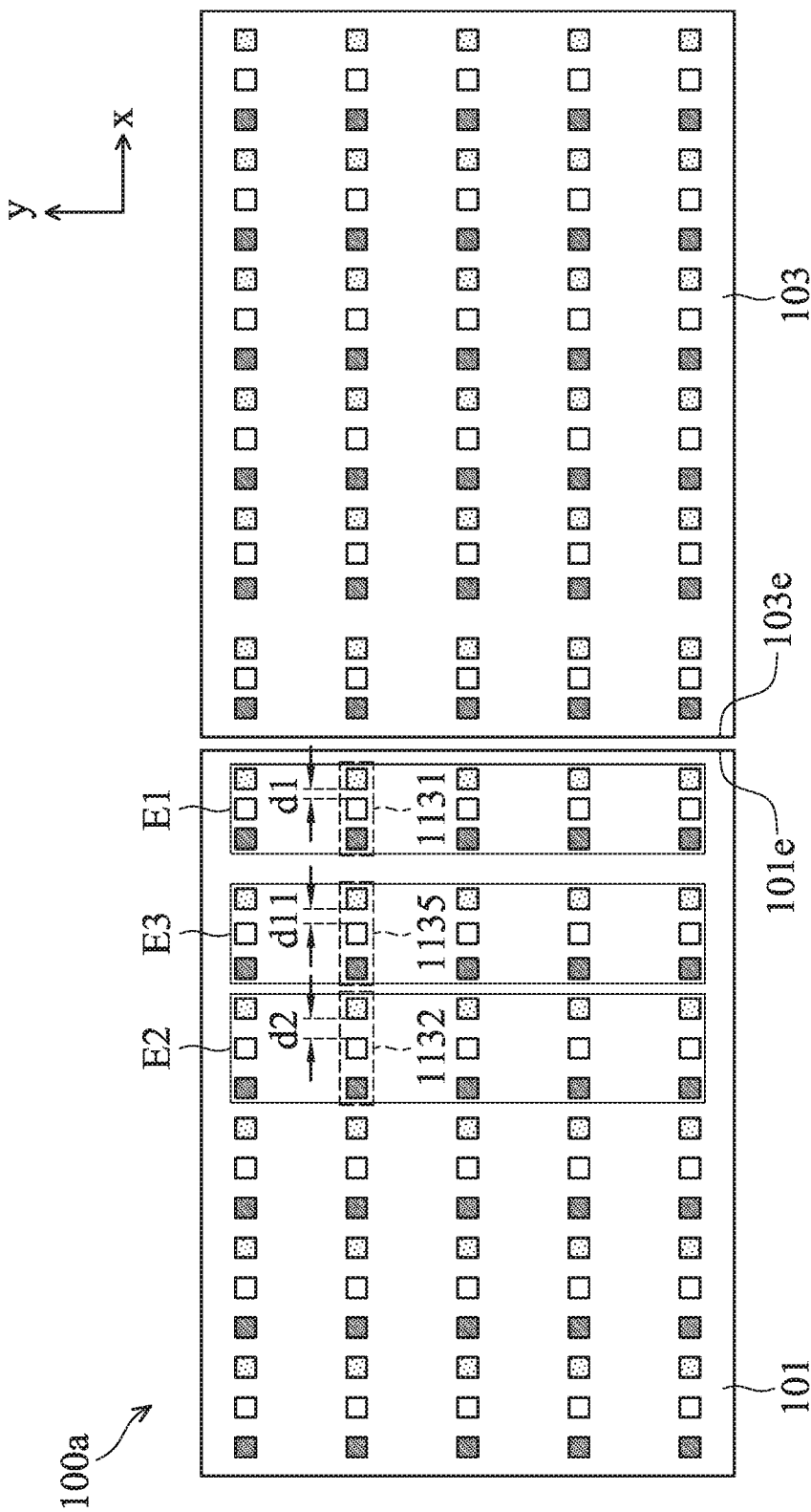
FIG. 4 is a top view of a tile display device in accordance with some embodiments.

Referring to FIG. 4, a top view of the tile display device 100a according to some embodiments is shown. The first tile substrate 101 further includes a plurality of fifth pixels 1135. The fifth pixels 1135 are located between the first pixels 1131 and the second pixels 1132 and each of the fifth pixels 1135 respectively includes a plurality of light emitting units. A distance between two adjacent light emitting units of one of the fifth pixels 1135 is defined as an eleventh distance d11.

In some embodiments, the eleventh distance d11 is greater than the first distance d1 and less than the second distance d2. In some embodiments, the first distance d1, the eleventh distance d11, and the second distance d2 are increased progressively. By doing so, the distance between adjacent light emitting units can be adjusted smoothly across the first tile substrate 101. In some other embodiments, the first distance d1, the eleventh distance d11, and the second distance d2 may be increased non-progressively. In some embodiments, the first distance d1, the eleventh distance d11, and the second distance d2 may be adjusted as having unequal spacing.

Still referring to FIG. 4, the first tile substrate 101 further includes a fifth portion E3 located between the first portion E1 and the second portion E2. A unit density of light emitting units of the fifth portion E3 is defined as a fifth unit density, and the fifth unit density is greater than the second unit density of the second portion E2 and less than the first unit density of the first portion E1. By doing so, the unit densities of different portions can vary smoothly across the first tile substrate 101.

In some embodiments, the first tile substrate 101 has difference unit densities in difference areas, the unit densities are progressively decreased from the first edge 101e to the opposite edge of first tile substrate 101. In some other embodiments, the first unit density of the first portion E1, the fifth unit density of the fifth portion E3 and the second unit density of the second portion E2 are decreased non-progressively.

Figure 5:
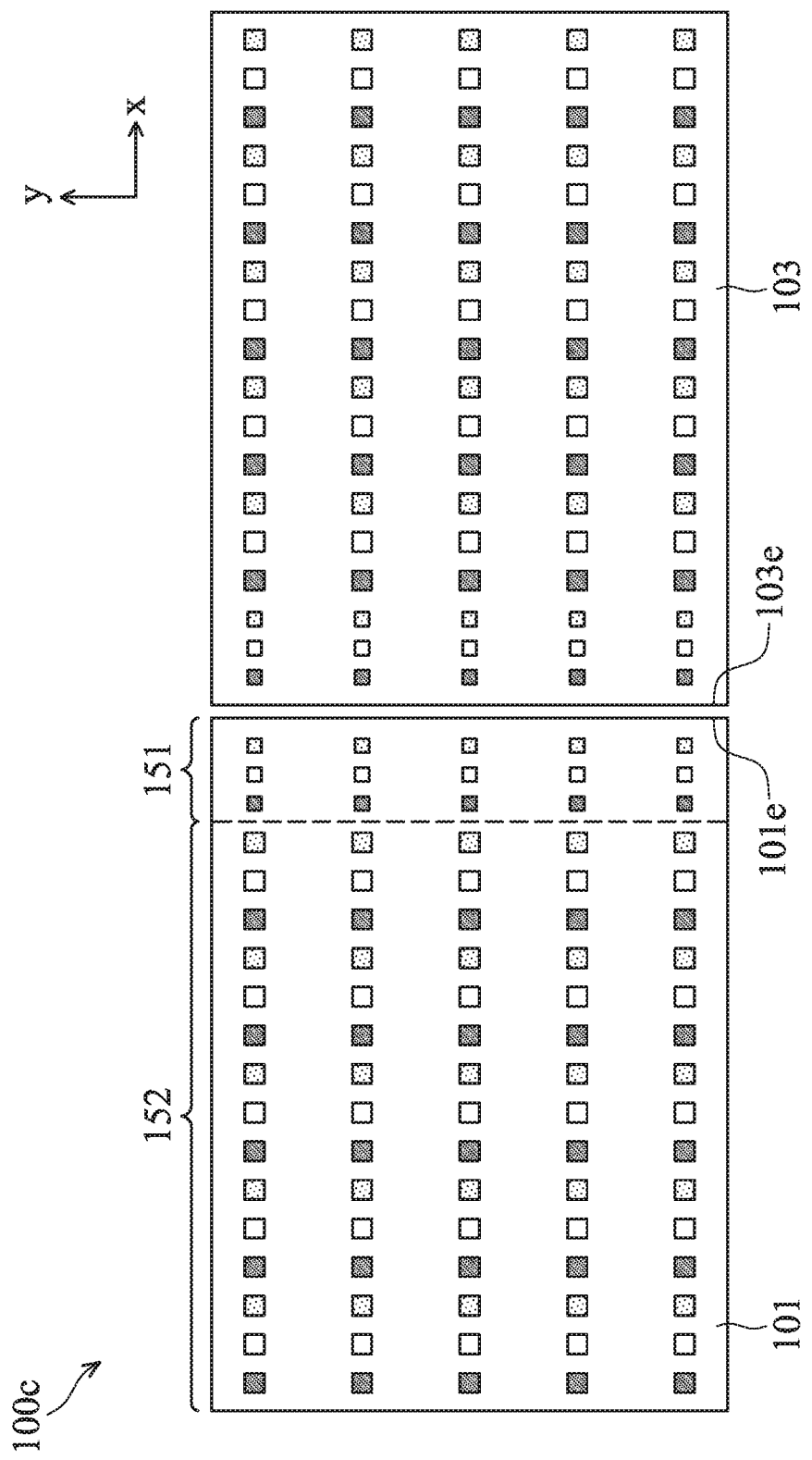
FIG. 5 is a top view of a tile display device in accordance with some embodiments.

Referring to FIG. 5, a top view of a tile display device 100c according to some embodiments is shown. In some embodiments, the first tile substrate 101 can be divided into a first portion 151 and a second portion 152. The first portion 151 is closer to the first edge 101e than the second portion 152. To make adjacent light emitting units closer, the size of one of the light emitting units of the first portion 151 is smaller than the size of one of the light emitting units of the second portion 152. Optionally, the light emitting unit of the first portion 151 has a better light emitting efficiency than the light emitting unit of the second portion 152. The light emitting efficiency is defined as the brightness of the light emitting unit under a unit light emitting area.

The size of the light emitting unit may be defined as a size of a luminance area, which can be observed through an optical spectroscope when the light emitting unit emits light, or the luminance area is equal to an opening area of the pixel defining layer in one sub-pixel of an OLED device. One light emitting unit of the first portion 151 and another one light emitting unit of the second portion 152 having the same color are used to compare the size. Optionally, as shown in FIGS. 1~4, since the first unit density of the first portion is greater than the second unit density of the second portion, the light emitting units of the second portion may have better light emitting efficiency than the light emitting units of the first portion so as to improve brightness uniformity.

In addition, each of the first tile substrate 101 and 121 and each of the second tile substrate 103 and 123 can be assembled individually as a display device. In some embodiments, the foregoing display device may have different light emitting unit densities in difference portions. The light emitting unit densities are progressively changed from one edge to the opposite edge. Moreover, the foregoing display device may have the above mentioned arrangement and features.

Furthermore, in some embodiments, the first tile substrate 101 and the second tile substrate 103 are tiled with a seam between them. However, in other embodiments, the first tile substrate 101 may individually adjoin to the second tile substrate 103. In some other embodiments, the first tile substrate 101 may individually be embedded into the second tile substrate 103, but the disclosure is not limited thereto.

Some embodiments of the disclosure provide tile display devices and display devices. To achieve greater seamless visual effect in high-resolution displays, some embodiments of the tile display devices have portions with different unit densities.

Specifically, a tile substrate is provided, and a first portion and a second portion are selected on the tile substrate. The first portion and the second portion do not completely overlap, and the first portion is closer to the edge of the tile substrate that is adjacent to another tile substrate than the second portion in the direction x. In some embodiments, the light emitting unit density of the first portion is greater than the light emitting unit density of the second portion. Therefore, the pitch of the pixels across the seam between two adjacent tile substrates is similar to or the same as the pitch of the pixels on one tile substrate.

From another point of view, the tile substrate has a first pixel and a second pixel which do lot completely overlap. The first pixel is closer to the edge of the first tile substrate than the second pixel. In some embodiments, the first pixel has a first distance between two adjacent light emitting units. The second pixel has a second distance between two adjacent light emitting units. The second distance is greater than the first distance. The pixels formed by the light emitting units may have the same pitch between each other, even the pitch of the pixels (the pixels individually are close to the edges of the tile substrates) across the seam between two adjacent tile substrates can be the same as others.

The above mentioned embodiments take rectangular tile substrates as an example, but the disclosure is also applicable to other non-rectangular tile substrates (such as arcs, polygons, or other shapes). The above mentioned tile display devices have two tile substrates as an example, but the tile display devices may also have more than two tile substrates, other tile substrates may be deposed on the left side of the first tile substrate or the right side of the second tile substrate. In other embodiments, other tile substrates may be deposed on upper side of the first tile substrate or lower side of the first tile substrate. That is, the tile edge of the substrate may be more than one.

Moreover, the pitch of the pixels may not be increased by the reserved space for processing, which is located at the edges of the tile substrate. As a result, a seamless visual effect in high-resolution displays can be obtained.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes or achieving the same advantages of the embodiments introduced herein. Those skilled in the art should also realize that such equivalent constructions do not depart from the spirit and scope of the present disclosure, and that they may make various changes, substitutions, or alterations herein without departing from the spirit and scope of the present disclosure.

What is claimed is:

1. A tile display device, comprising:
a first tile substrate comprising a plurality of first pixels and a plurality of second pixels, each of the first pixels and each of the second pixels respectively comprises a plurality of light emitting units; and
a second tile substrate adjacent to the first pixels of the first tile substrate;
wherein a distance between two adjacent light emitting units of one of the first pixels is defined as a first distance, a distance between two adjacent light emitting units of one of the second pixels is defined as a second distance, and the first distance is less than the second distance,
wherein the second tile substrate comprises a plurality of third pixels and a plurality of fourth pixels, the third pixels are located between the first pixels and the fourth pixels, each of the third pixels and each of the fourth pixels respectively comprises a plurality of light emitting units, and a distance between two adjacent light emitting units of one of the third pixels is defined as a third distance, a distance between two adjacent light emitting units of one of the fourth pixels is defined as a fourth distance, and the third distance is less than the fourth distance.

2. The tile display device as claimed in claim 1, wherein a ratio of the first distance to the second distance is in a range from 0.2 to 0.95.

3. The tile display device as claimed in claim 1, wherein a distance between two adjacent first pixel and second pixel is greater than a distance between two adjacent second pixels.

4. The tile display device as claimed in claim 1, wherein a ratio of the first distance to the third distance is in a range from 0.8 to 1.25.

5. The tile display device as claimed in claim 1, wherein a pixel pitch of two adjacent first pixel and third pixel is defined as a first pixel pitch, a pixel pitch of two adjacent second pixels is defined as a second pixel pitch, and a ratio of the first pixel pitch to the second pixel pitch is in a range from 0.9 to 1.5.

6. The tile display device as claimed in claim 1, wherein the first tile substrate comprises a plurality of fifth pixels, the fifth pixels are located between the first pixels and the second pixels, and each of the fifth pixels comprises a plurality of light emitting units, a distance between two adjacent light emitting units of one of the fifth pixels is defined as a fifth distance, and the fifth distance is greater than the first distance and less than the second distance.

* * * * *